(12) United States Patent
Clevenger et al.

(10) Patent No.: US 7,825,019 B2
(45) Date of Patent: Nov. 2, 2010

(54) STRUCTURES AND METHODS FOR REDUCTION OF PARASITIC CAPACITANCES IN SEMICONDUCTOR INTEGRATED CIRCUITS

(75) Inventors: Lawrence A. Clevenger, LaGrangeville, NY (US); Stephan Grunow, Poughkeepsie, NY (US); Kaushik A. Kumar, Beacon, NY (US); Kevin Shawn Petrarca, Newburgh, NY (US); Vidhya Ramachandran, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 125 days.

(21) Appl. No.: 11/863,724

(22) Filed: Sep. 28, 2007

(65) Prior Publication Data

US 2009/0085210 A1    Apr. 2, 2009

(51) Int. Cl.
    *H01L 21/44* (2006.01)
(52) U.S. Cl. ............ 438/599; 438/396; 438/926; 438/129; 438/928; 257/E21.573
(58) Field of Classification Search ......... 438/396, 438/926, 129, 599, 928; 257/E21.573
    See application file for complete search history.

(56) References Cited

U.S. PATENT DOCUMENTS

| | | | |
|---|---|---|---|
| 6,281,049 B1* | 8/2001 | Lee | 438/129 |
| 2004/0121577 A1* | 6/2004 | Yu et al. | 438/622 |
| 2005/0088551 A1* | 4/2005 | Lee et al. | 348/272 |
| 2007/0170547 A1* | 7/2007 | Chang et al. | 257/532 |
| 2008/0311742 A1* | 12/2008 | Watanabe et al. | 438/675 |

* cited by examiner

*Primary Examiner*—Matthew Smith
*Assistant Examiner*—John M Parker
(74) *Attorney, Agent, or Firm*—Schmeiser, Olsen & Watts; Daniel Schnurmann

(57) ABSTRACT

A semiconductor structure and a method for forming the same. The structure includes (a) a substrate which includes semiconductor devices and (b) a first ILD (inter-level dielectric) layer on top of the substrate. The structure further includes N first actual metal lines in the first ILD layer, N being a positive integer. The N first actual metal lines are electrically connected to the semiconductor devices. The structure further includes first trenches in the first ILD layer. The first trenches are not completely filled with solid materials. If the first trenches are completely filled with first dummy metal lines, then (i) the first dummy metal lines are not electrically connected to any semiconductor device and (ii) the N first actual metal lines and the first dummy metal lines provide an essentially uniform pattern density of metal lines across the first ILD layer.

14 Claims, 7 Drawing Sheets

STRUCTURES AND METHODS FOR REDUCTION OF PARASITIC CAPACITANCES IN SEMICONDUCTOR INTEGRATED CIRCUITS

FIELD OF THE INVENTION

The present invention relates generally to semiconductor integrated circuits and more particularly to structures and methods for reduction of parasitic capacitances in semiconductor integrated circuits.

BACKGROUND OF THE INVENTION

In a conventional semiconductor integrated circuit, there exist parasitic capacitances between metal lines of the interconnect layers of the integrated circuit and other conductive elements in the chip both part of the circuit and otherwise. Therefore, there is a need for structures (and methods for forming the same) in which parasitic capacitances are lower than that of the prior art.

SUMMARY OF THE INVENTION

The present invention provides a semiconductor structure, comprising (a) a substrate including semiconductor devices; (b) a first ILD (inter-level dielectric) layer on top of the substrate; (c) N first actual metal lines in the first ILD layer, N being a positive integer, wherein the N first actual metal lines are electrically connected to the semiconductor devices; and (c) first trenches in the first ILD layer, wherein the first trenches are not completely filled with solid materials, wherein if the first trenches are completely filled with first dummy metal lines, then the first dummy metal lines are not electrically connected to any semiconductor device, and wherein if the first trenches are completely filled with the first dummy metal lines, then the N first actual metal lines and the first dummy metal lines provide an essentially uniform pattern density of metal lines across the first ILD layer.

The present invention provides structures (and methods for forming the same) in which parasitic capacitances are lower than that of the prior art.

DETAILED DESCRIPTION OF THE INVENTION

FIGS. 1A-1F show cross-section views used to illustrate a fabrication process of a structure 100, in accordance with embodiments of the present invention. More specifically, with reference to FIG. 1A, the fabrication process of the structure 100 starts with a dielectric layer 110. The dielectric layer 110 can comprise silicon dioxide. The dielectric layer 110 can be on top of N interconnect layers (not shown) of a chip (not shown), N being a positive integer. The N interconnect layers can be on top of a front-end-of-line (FEOL) layer (not shown) of the chip wherein the FEOL layer contains semiconductor devices such as transistors, resistors, capacitors, etc. (not shown) of the chip. Each of the N interconnect layers contains metal lines electrically connected to semiconductor devices in the underlying FEOL layer or metal lines in an underlying interconnect layer.

Next, in one embodiment, actual diffusion barrier liners 112a, dummy diffusion barrier liners 112d, actual metal lines 114a, dummy metal lines 114d, and vias (not shown) are formed in the dielectric layer 110. The actual diffusion barrier liners 112a and the dummy diffusion barrier liners 112d can comprise Ta, Ti, Ru, RuTa, TaN, TiN, or RuTaN. The actual metal lines 114a and the dummy metal lines 114d can comprise copper. The actual diffusion barrier liners 112a and the actual metal lines 114a are electrically connected to semiconductor devices in the underlying FEOL layer or metal lines of the underlying interconnect layer through the vias. In contrast, the dummy diffusion barrier liners 112d and the dummy metal lines 114d are not electrically connected to any device in the underlying FEOL layer or any metal line of the underlying interconnect layer. The dummy diffusion barrier liners 112d and the dummy metal lines 114d are formed to provide a uniform pattern density of diffusion barrier liners and metal lines across the dielectric layer 110. The actual diffusion barrier liners 112a, the dummy diffusion barrier liners 112d, the actual metal lines 114a, the dummy metal lines 114d, and the vias can be formed by a conventional dual damascene process or a single damascene process.

Figure 1A:
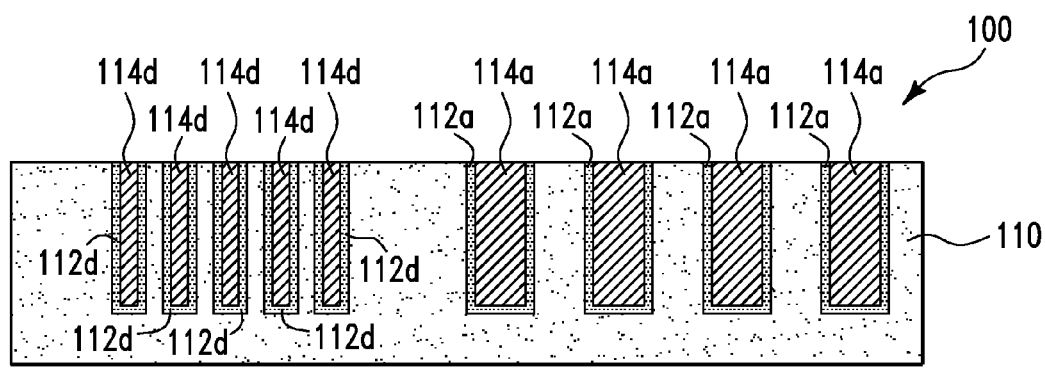
FIGS. 1A-1F show cross-section views used to illustrate a fabrication process of a structure, in accordance with embodiments of the present invention.
Figure 1B:
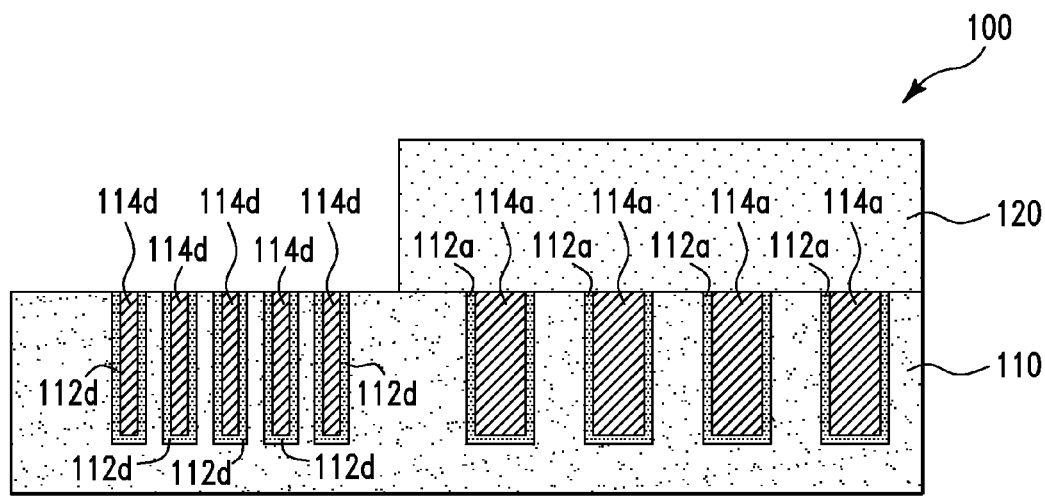

Next, with reference to FIG. 1B, in one embodiment, a photoresist region 120 is formed on top of the actual metal lines 114a and the actual diffusion barrier liners 112a such that the dummy metal lines 114d and the dummy diffusion barrier liners 112d are exposed to the surrounding ambient. The photoresist region 120 can be formed by a conventional lithographic process.

Figure 1C:
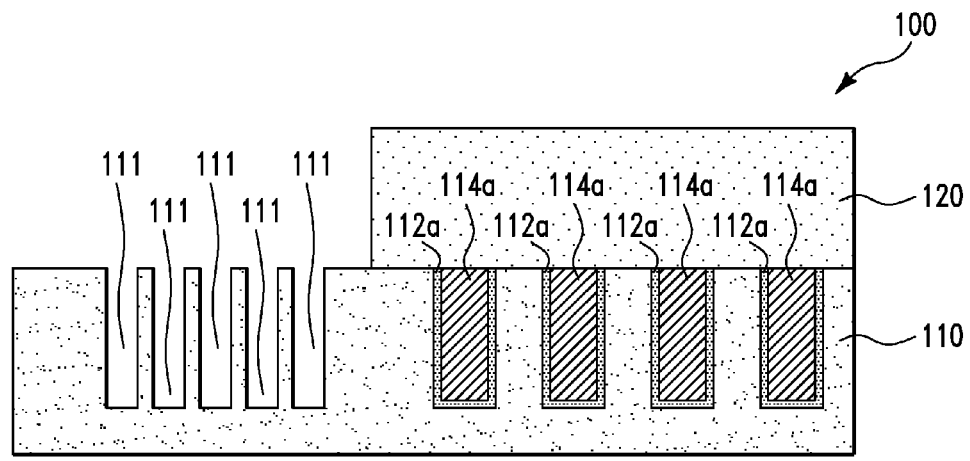

Next, in one embodiment, the metal and liner material in the dummy metal lines 114d and the dummy diffusion barrier liners 112d are removed resulting in empty trenches 111 of FIG. 1C. The dummy metal lines 114d and the dummy diffusion barrier liners 112d can be removed by wet etching with the photoresist region 120 as a blocking mask. More specifically, the dummy metal lines 114d and the dummy diffusion barrier liners 112d can be in turn removed by (i) wet etching the dummy metal lines 114d and then (ii) wet etching the dummy diffusion barrier liners 112d. In an alternative embodiment, the dummy metal lines 114d and the dummy diffusion barrier liners 112d are removed simultaneously by wet etching.

Figure 1D:
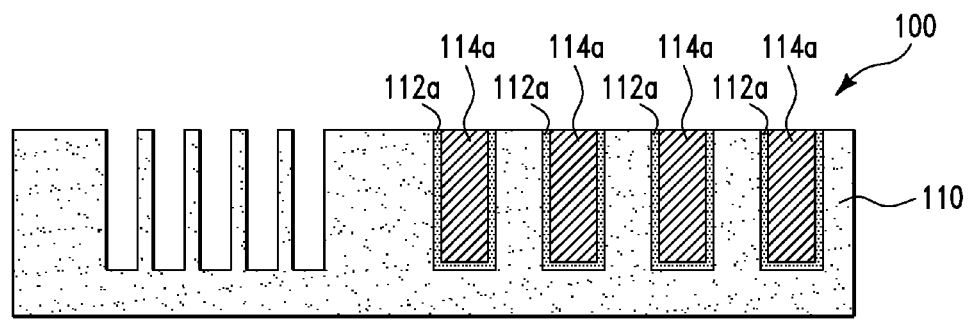

Next, with reference to FIG. 1C, in one embodiment, the photoresist region 120 is removed resulting in structure 100 of FIG. 1D. The photoresist region 120 can be removed by wet etching.

Figure 1E:
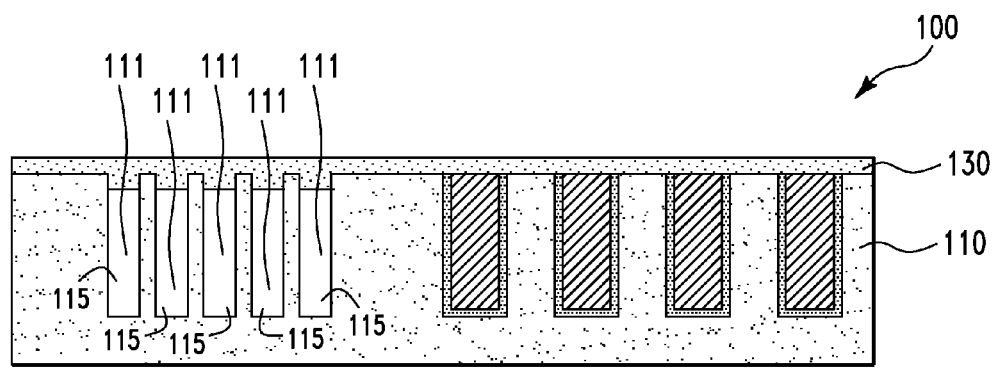

Next, with reference to FIG. 1E, in one embodiment, a dielectric passivation layer 130 is formed on top of the structure 100 of FIG. 1D such that the dielectric passivation layer 130 covers but does not completely fill the trenches 111. As a result, the dielectric passivation layer 130 and the dielectric layer 110 form enclosed empty spaces 115 in the trenches 111. The enclosed empty spaces 115 may contain vacuum, gases such as inert gases, or vapors, but do not contain solid materials. The dielectric passivation layer 130 can comprise silicon nitride. The dielectric passivation layer 130 can be formed by CVD (Chemical Vapor Deposition) of silicon nitride on top of the structure 100 of FIG. 1D resulting in the dielectric passivation layer 130. The passivation layer can also be other materials such as silicon carbide, organic based compounds, etc, and can be applied by a number of different techniques such as a spin-on or dip coat, PVD, etc. It should be noted that there is some silicon nitride on side walls and bottom walls of the trenches 111, but the silicon nitride on side walls and bottom walls of the trenches 111 is not shown in FIG. 1E for simplicity.

Figure 1F:
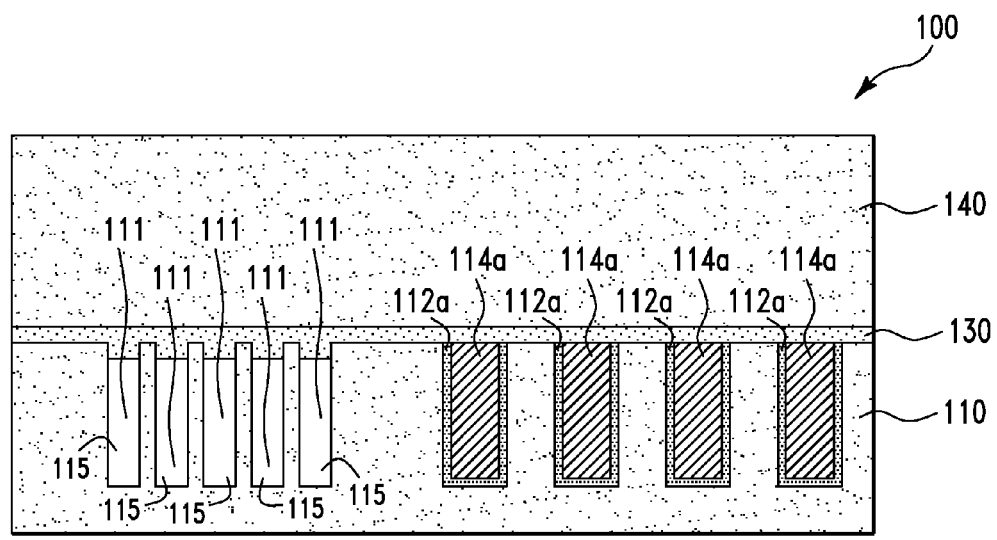

Next, with reference to FIG. 1F, in one embodiment, a dielectric layer 140 is formed on top of the dielectric passivation layer 130. The dielectric layer 140 can comprise silicon dioxide. The dielectric layer 140 can be formed by a CVD process.

Next, in one embodiment, dummy and actual diffusion barrier liners, dummy and actual metal lines, and vias (not shown) are formed in the dielectric layer 140. The dummy diffusion barrier liners and dummy metal lines in the dielectric layer 140 are similar to the dummy diffusion barrier liners 112d and dummy metal lines 114d (FIG. 1A) in the dielectric layer 110, respectively. The actual diffusion barrier liners and actual metal lines in the dielectric layer 140 are similar to the actual diffusion barrier liners 112a and actual metal lines 114a (FIG. 1A) in the dielectric 110, respectively. The actual diffusion barrier liners and actual metal lines in the dielectric layer 140 are electrically connected to the actual diffusion barrier liners 112a and actual metal lines 114a in the dielectric layer 110 through the vias in the dielectric layer 140. The dummy and actual diffusion barrier liners, the dummy and actual metal lines, and the vias in the dielectric layer 140 can be formed by a conventional dual damascene process.

In summary, on the one hand, with reference to FIG. 1A, the dummy diffusion barrier liners 112d and the dummy metal lines 114d provide a uniform pattern density of diffusion barrier liners and metal lines across the dielectric layer 110 during the formation of the actual diffusion barrier liners 112a and the actual metal lines 114a. On the other hand, with reference to FIG. 1F, with the dummy diffusion barrier liners 112d and the dummy metal lines 114d (FIG. 1A) in the trenches 111 being removed, the parasitic capacitance caused by the dummy metal lines 114d and the dummy diffusion barrier liners 112d is eliminated. In addition, the enclosed empty spaces 115 in the trenches 111 (that may contain vacuum, gases such as inert gases, or vapors) result in a lower effective dielectric constant for material around the actual diffusion barrier liners 112a and the actual metal lines 114a.

Figure 2A:
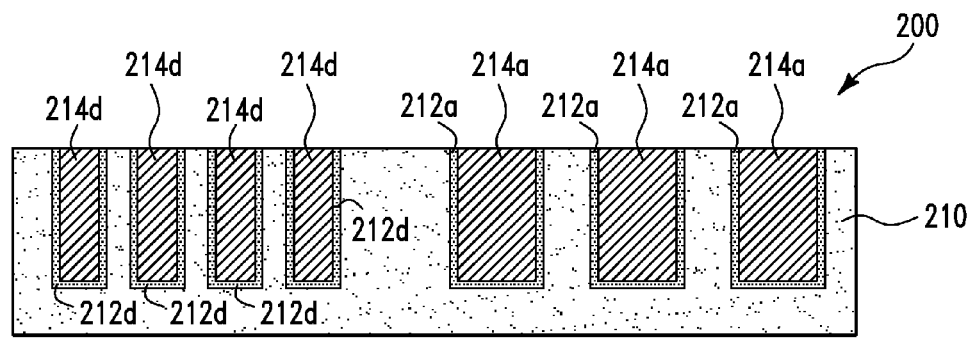
FIGS. 2A-2H show cross-section views used to illustrate a fabrication process of another structure, in accordance with embodiments of the present invention.

FIGS. 2A-2H show cross-section views used to illustrate a fabrication process of a structure 200, in accordance with embodiments of the present invention. More specifically, with reference to FIG. 2A, the fabrication process of the structure 200 starts with the structure 200 of FIG. 2A. The structure 200 of FIG. 2A is similar to the structure 100 of FIG. 1A. More specifically, the structure 200 comprises actual diffusion barrier liners 212a, dummy diffusion barrier liners 212d, actual metal lines 214a, dummy metal lines 214d in a dielectric layer 210. The actual diffusion barrier liners 212a and the actual metal lines 214a are electrically connected to semiconductor devices in the underlying FEOL layer or metal lines of the underlying interconnect layer through vias (not shown), whereas the dummy diffusion barrier liners 112d and the dummy metal lines 114d are not electrically connected to any device in the underlying FEOL layer or any metal line of the underlying interconnect layer. The formation of the structure 200 is similar to the formation of the structure 100 of FIG. 1A.

Figure 2B:
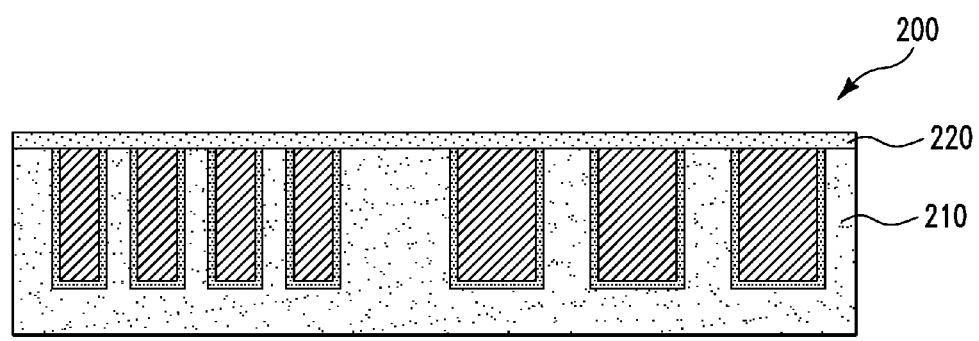

Next, with reference to FIG. 2B, in one embodiment, a dielectric passivation layer 220 is formed on top of the structure 200 of FIG. 2A. The dielectric passivation layer 220 can comprise silicon nitride, silicon carbide, some organic based compounds etc. The dielectric passivation layer 220 can be formed by CVD of silicon nitride on top of the structure 200 of FIG. 2A.

Figure 2C:
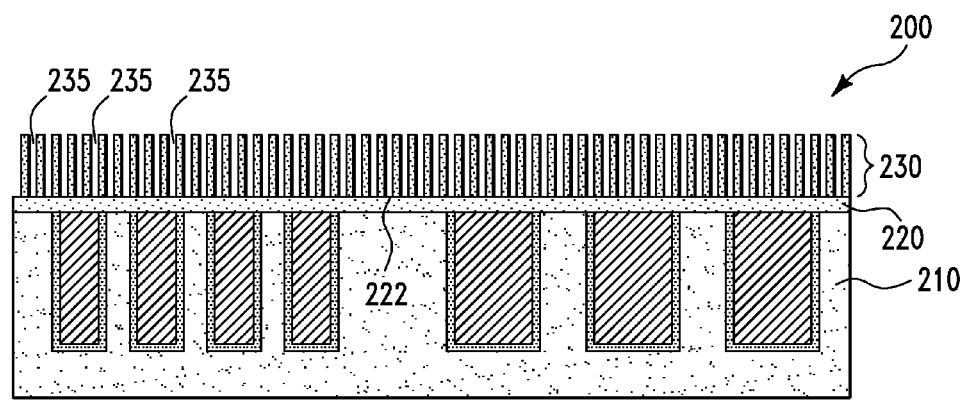

Next, with reference to FIG. 2C, in one embodiment, a porous structure layer 230 is formed on top of the dielectric passivation layer 220. The top surface 222 of the dielectric passivation layer 220 is exposed to the surrounding ambient through pores 235 of the porous structure layer 230. The porous structure layer 230 can comprise a polymer material. The porous structure layer 230 can be formed by (i) spin-on a special material including, illustratively, two polymers on top of the dielectric passivation layer 220 and then (ii) baking the special material such that one of the two polymers evaporates, whereas the other polymer remains resulting in the porous structure layer 230.

Figure 2D:
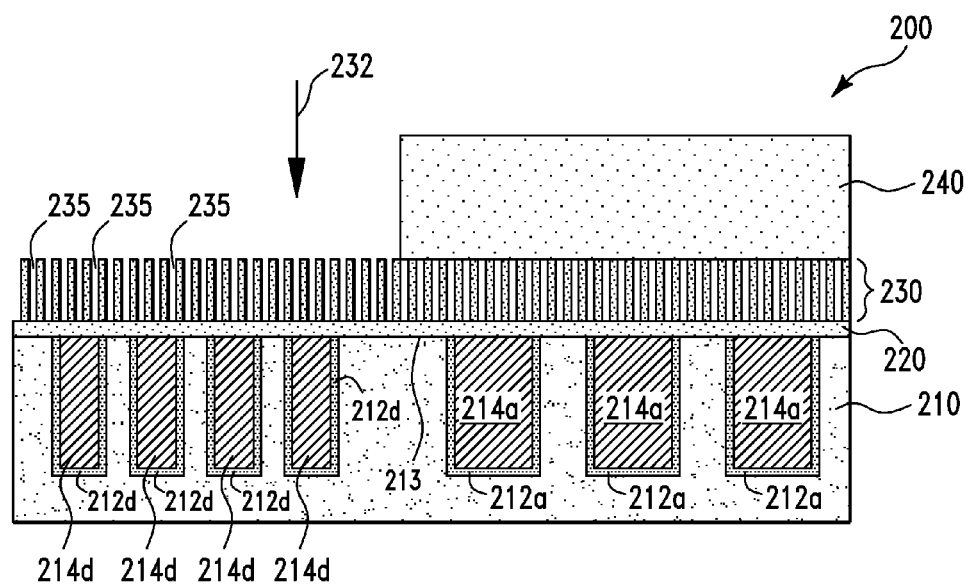

Next, with reference to FIG. 2D, in one embodiment, a photoresist region 240 is formed on top of the porous structure layer 230 such that the actual metal lines 214a and the actual diffusion barrier liners 212a are directly beneath the photoresist region 240 in a reference direction defined by an arrow 232 (also called a reference direction 232). In other words, the entire actual metal lines 214a and the entire actual diffusion barrier liners 212a overlap the photoresist region 240 in the reference direction 232. The reference direction 232 is perpendicular to the top surface 213 of the dielectric layer 210. In addition, the dummy metal lines 214d and the dummy diffusion barrier liners 212d are not directly beneath the photoresist region 240 in the reference direction 232. In other words, the dummy metal lines 214d and the dummy diffusion barrier liners 212d do not overlap the photoresist region 240 in the reference direction 232. The photoresist region 240 can be formed by a conventional lithographic process.

Figure 2E:
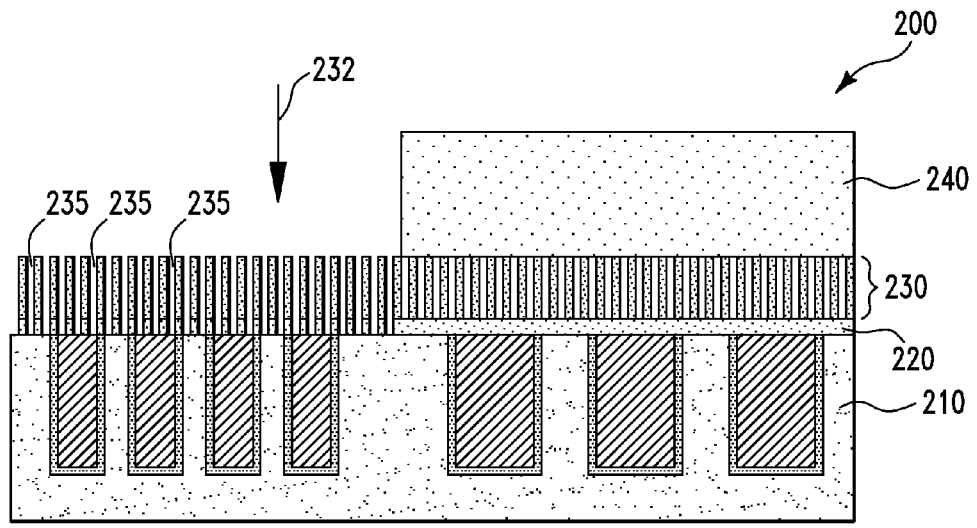

Next, in one embodiment, the dielectric passivation layer 220 is anisotropically etched (in the reference direction 232) with the porous structure layer 230 and the photoresist region 240 as blocking masks resulting in the structure 200 of FIG. 2E. As a result of the etching of the dielectric passivation layer 220, the top surfaces of the dummy metal lines 214d and the dummy diffusion barrier liners 212d are exposed to the surrounding ambient through the empty spaces of the removed portions of the dielectric passivation layer 220 and the pores 235 of the porous structure layer 230.

Figure 2F:
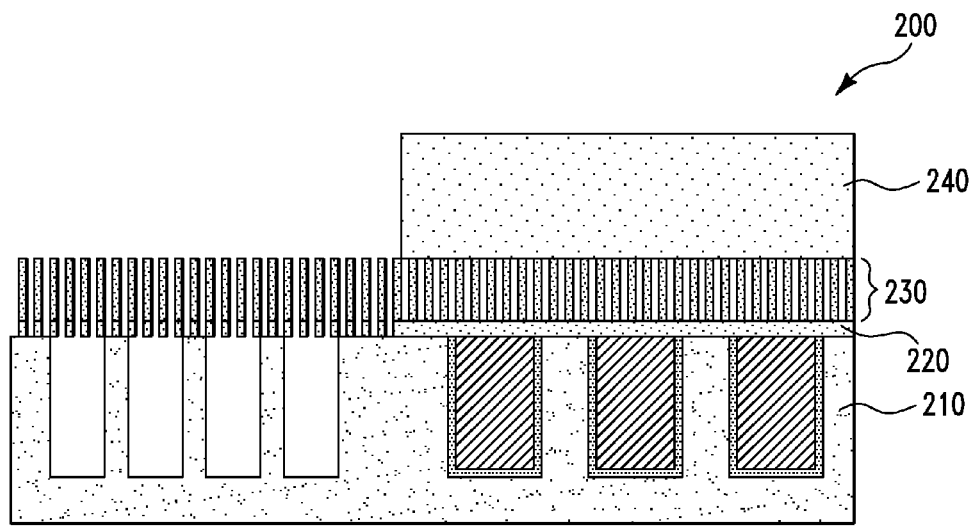

Next, in one embodiment, the dummy metal lines 214d and the dummy diffusion barrier liners 212d are removed resulting in structure 200 of FIG. 2F. The dummy metal lines 214d and the dummy diffusion barrier liners 212d can be removed by wet etching. More specifically, the dummy metal lines 114d and the dummy diffusion barrier liners 112d can be in turn removed by (i) wet etching the dummy metal lines 214d and then (ii) wet etching the dummy diffusion barrier liners 212d. In an alternative embodiment, the dummy metal lines 114d and the dummy diffusion barrier liners 112d are removed simultaneously by wet etching. This etching of the dummy metal lines 214d and the dummy diffusion barrier liners 212d is essentially selective to the dielectric layer 210 and the dielectric passivation layer 220. In other words, the chemistry of the recipe of the etching of the dummy metal lines 214d and the dummy diffusion barrier liners 212d (e.g., chemicals used, temperature, pressure, ect.) is such that the dielectric layer 210 and the dielectric passivation layer 220 are essentially not affected by the etching of the dummy metal lines 214d and the dummy diffusion barrier liners 212d.

Figure 2G:
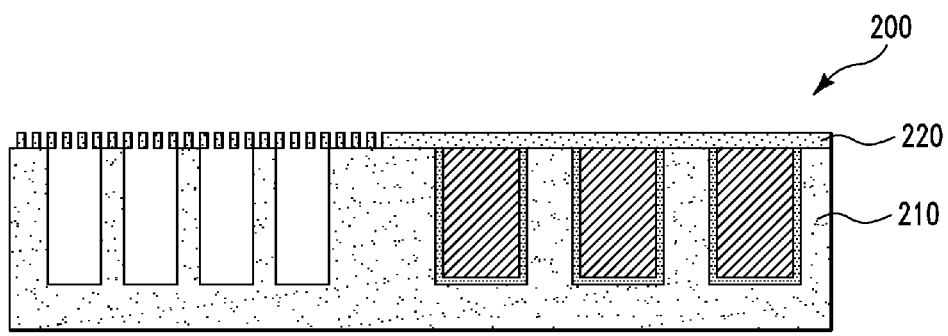

Next, with reference to FIG. 2F, in one embodiment, the photoresist region 240 and the porous structure layer 230 are removed resulting in the structure 200 of FIG. 2G. The photoresist region 240 and the porous structure layer 230 can be removed by wet etching or by a downstream plasma etch.

Figure 2H:
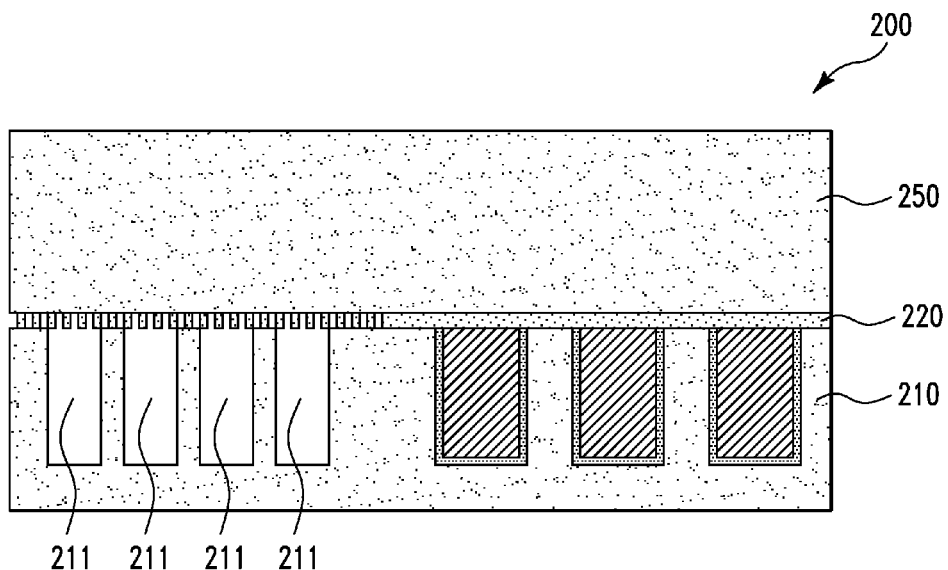

Next, with reference to FIG. 2H, in one embodiment, a dielectric layer 250 is formed on top of the dielectric passivation layer 220. The dielectric layer 250 can comprise silicon dioxide. The dielectric layer 250 can be formed by a conventional CVD process.

Next, in one embodiment, dummy and actual diffusion barrier liners, dummy and actual metal lines, and vias (not shown) are formed in the dielectric layer 250. The dummy diffusion barrier liners and dummy metal lines in the dielectric layer 2500 are similar to the dummy diffusion barrier liners 212d and dummy metal lines 214d (FIG. 2A) in the dielectric layer 210, respectively. The actual diffusion barrier liners and actual metal lines in the dielectric layer 250 are similar to the actual diffusion barrier liners 212a and actual metal lines 214a (FIG. 2A) in the dielectric 210, respectively. The actual diffusion barrier liners and actual metal lines in the dielectric layer 250 are electrically connected to the actual diffusion barrier liners 212a and actual metal lines 214a in the dielectric layer 210 through the vias in the dielectric layer 250. The dummy and actual diffusion barrier liners, the dummy and actual metal lines, and the vias in the dielectric layer 250 can be formed by a conventional dual damascene process.

In summary, on the one hand, with reference to FIG. 2A, the dummy diffusion barrier liners 212d and the dummy metal lines 214d provide a uniform pattern density of diffusion barrier liners and metal lines across the dielectric layer 210 during the formation of the actual diffusion barrier liners 212a and the actual metal lines 214a. On the other hand, with reference to FIG. 2H, with the dummy diffusion barrier liners 212d and the dummy metal lines 214d (FIG. 2A) in the trenches 211 being removed, the parasitic capacitance caused by the dummy metal lines 214d and the dummy diffusion barrier liners 212d is eliminated. In addition, the trenches 211 that are not completely filled with solid materials (i.e., the trenches 211 may contain vacuum, gases such as inert gases, or vapors) result in a lower effective dielectric constant for material around the actual diffusion barrier liners 212a and the actual metal lines 214a.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure fabrication method, comprising:
    providing a structure which includes:
        (i) a substrate,
        (ii) semiconductor devices on the substrate,
        (iii) a first ILD (inter-level dielectric) layer on top of the substrate and the semiconductor devices, wherein the substrate includes a top substrate surface which defines a reference direction perpendicular to the top substrate surface,
        (iv) N first actual trenches and M first dummy trenches in the first ILD layer, N and M being positive integers,
        (v) N first actual metal lines and M first dummy metal lines, wherein each first actual metal line of the N first actual metal lines is in a respective first actual trench of the N first actual trenches, wherein each first dummy metal line of the M first dummy metal lines is in a respective first dummy trench of the M first dummy trenches, wherein the N first actual metal lines are electrically connected to the semiconductor devices, wherein the M first dummy metal lines are not electrically connected to any semiconductor device, and wherein the N first actual metal lines and the M first dummy metal lines provide an essentially uniform pattern density of metal lines across the first ILD layer, and
        (vi) N first actual diffusion barrier liners and M first dummy diffusion barrier liners, wherein each first actual diffusion barrier liner of the N first actual diffusion barrier liners is in direct physical contact with a corresponding first actual metal line of the N first actual metal lines, and wherein each first dummy diffusion barrier liner of the M first dummy diffusion barrier liners is in direct physical contact with a corresponding first dummy metal line of the M first dummy metal lines;
    removing the M first dummy metal lines without removing the N first actual metal lines; and
    forming a dielectric passivation layer on top of the first ILD layer such that the M first dummy trenches are partially but not completely filled by the dielectric passivation layer to form an enclosed space not comprising any solid material within each first dummy trench.

2. The method of claim 1, wherein said removing the M first dummy metal lines comprises:
    forming a photoresist region on top of the N first actual metal lines such that the M first dummy metal lines are exposed to a surrounding ambient; and
    after said limning the photoresist region, wet etching the M first dummy metal lines.

3. The method of claim 1, further comprising, after said removing the M first dummy metal lines is performed, removing the M first dummy diffusion barrier liners resulting in side walls and bottom walls of the M first dummy trenches being exposed to a surrounding ambient.

4. The method of claim 1, further comprising:
    forming a second ILD layer on top of the first ILD layer;
    forming P second actual trenches and Q second dummy trenches in the second ILD layer, P and Q being positive integers;
    forming P second actual metal lines and Q second dummy metal lines, wherein each second actual metal line of the P second actual metal lines is in a corresponding second actual trench of the P second actual trenches, wherein each second dummy metal line of the Q second dummy metal lines is in a corresponding second dummy trench of the Q second dummy trenches, wherein the P second actual metal lines are electrically connected to the semiconductor devices, wherein the Q second dummy metal lines are not electrically connected to any semiconductor device, and wherein the P second actual metal lines and the Q second dummy metal lines provide an essentially uniform pattern density of metal lines across the second ILD layer; and
    removing the Q second dummy metal lines without removing the P second actual metal lines.

5. The method of claim 4, further comprising, after said forming the P second actual trenches and the Q second dummy trenches is performed and before said forming the P second actual metal lines and the Q second dummy metal lines is performed, forming P second actual diffusion barrier liners and Q second dummy diffusion barrier liners,
    wherein each second actual diffusion barrier liner of the P second actual diffusion barrier liners is in direct physical contact with a respective second actual metal line of the P second actual metal lines, and
    wherein each second dummy diffusion barrier liner of the Q second dummy diffusion barrier liners is in direct physical contact with a respective second dummy metal line of the Q second dummy metal lines.

6. A semiconductor structure fabrication method, comprising:
  providing a structure which includes:
   (i) a substrate,
   (ii) semiconductor devices on the substrate,
   (iii) a first ILD (inter-level dielectric) layer on top of the substrate and the semiconductor devices, wherein the substrate includes a top substrate surface which defines a reference direction perpendicular to the top substrate surface,
   (iv) N first actual trenches and M first dummy trenches in the first ILD layer, N and M being positive integers,
   (v) N first actual metal lines and M first dummy metal lines, wherein each first actual metal line of the N first actual metal lines is in a respective first actual trench of the N first actual trenches, wherein each first dummy metal line of the M first dummy metal lines is in a respective first dummy trench of the M first dummy trenches, wherein the N first actual metal lines are electrically connected to the semiconductor devices, wherein the M first dummy metal lines are not electrically connected to any semiconductor device, and wherein the N first actual metal lines and the M first dummy metal lines provide an essentially uniform pattern density of metal lines across the first ILD layer;
  removing the M first dummy metal lines without removing the N first actual metal lines; and
  forming a dielectric passivation layer on top of the first ILD layer such that the M first dummy trenches are partially but not completely filled by the dielectric passivation layer to form an enclosed space not comprising any solid material within each first dummy trench.

7. The method of claim 6, wherein the dielectric passivation layer comprises silicon nitride.

8. The method of claim 6, wherein the enclosed space within each first dummy trench comprises a vacuum.

9. The method of claim 6, wherein the enclosed space within each first dummy trench comprises an inert gas.

10. The method of claim 6, wherein the enclosed space within each first dummy trench comprises a vapor.

11. A semiconductor structure fabrication method, comprising:
  providing a structure which includes:
   (i) a substrate,
   (ii) an ILD layer on top of the substrate, wherein the substrate includes a top substrate surface which defines a reference direction perpendicular to the top substrate surface,
   (iii) N first trenches and M second trenches in the ILD layer, N and M being positive integers, and
   (iv) N first metal lines and M second metal lines, wherein each first metal line of the N first metal lines is in a respective first trench of the N first trenches, and wherein each second metal line of the M second metal lines is in a respective second trench of the M second trenches;
  removing the M second metal lines without removing the N first metal lines; and
  depositing a dielectric passivation layer on top of the ILD layer such that the dielectric passivation layer and the ILD layer form enclosed empty spaces in the M second trenches, wherein the enclosed empty spaces do not contain any solid material.

12. The method of claim 11, wherein said removing the M second metal lines comprises:
  forming a photoresist region on top of the N first metal lines such that the M second metal lines are exposed to a surrounding ambient; and
  after said forming the photoresist region, wet etching the M second metal lines.

13. The method of claim 12, wherein said wet etching the M second metal lines is performed while the N first metal lines are not exposed to the surrounding ambient.

14. The method of claim 11,
  wherein the structure further includes N first diffusion barrier liners and M second diffusion barrier liners,
  wherein each first diffusion barrier liner of the N first diffusion barrier liners is in direct physical contact with a respective first metal line of the N first metal lines, and
  wherein each second diffusion barrier liner of the M second diffusion barrier liners is in direct physical contact with a respective second metal line of the M second metal lines.

* * * * *